United States Patent
Kimoto et al.

(10) Patent No.: US 10,175,518 B2
(45) Date of Patent: Jan. 8, 2019

(54) METHOD FOR MANUFACTURING DISPLAY DEVICE INCLUDING A WIRING LAYER OF A MOLYBDENUM-BASED MATERIAL

(71) Applicant: Sharp Kabushiki Kaisha, Sakai, Osaka (JP)

(72) Inventors: Hidenobu Kimoto, Sakai (JP); Tetsuya Tarui, Sakai (JP); Yoshihiro Seguchi, Sakai (JP); Takehisa Sugimoto, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 6 days.

(21) Appl. No.: 15/323,486

(22) PCT Filed: Jul. 23, 2015

(86) PCT No.: PCT/JP2015/070919
§ 371 (c)(1),
(2) Date: Jan. 3, 2017

(87) PCT Pub. No.: WO2016/017516
PCT Pub. Date: Feb. 4, 2016

(65) Prior Publication Data
US 2017/0139260 A1   May 18, 2017

(30) Foreign Application Priority Data

Jul. 30, 2014   (JP) ................................. 2014-154721

(51) Int. Cl.
*G09F 9/00* (2006.01)
*G09F 9/30* (2006.01)
(Continued)

(52) U.S. Cl.
CPC ...... *G02F 1/133345* (2013.01); *G02F 1/1368* (2013.01); *G02F 1/13458* (2013.01);
(Continued)

(58) Field of Classification Search
CPC ............................................. G02F 2001/13629
See application file for complete search history.

(56) References Cited

U.S. PATENT DOCUMENTS

2005/0253150 A1   11/2005   Motoshima et al.
2006/0050192 A1*   3/2006   Cho ................. G02F 1/136286
                                              349/42
(Continued)

FOREIGN PATENT DOCUMENTS

JP    09-127555 A    5/1997
JP    2004-165289 A    6/2004
(Continued)

OTHER PUBLICATIONS

Official Communication issued in International Patent Application No. PCT/JP2015/070919, dated Sep. 8, 2015.
(Continued)

*Primary Examiner* — Laurence J Lee
(74) *Attorney, Agent, or Firm* — Keating & Bennett, LLP

(57) ABSTRACT

There are provided a display device including a highly reliable wiring having excellent adhesion to an insulating film, and a method for manufacturing the same. A molybdenum-niobium layer has good adhesion to an insulating film, and thus, a first wiring having the molybdenum-niobium layer as an upper layer wiring is tightly adhered to a gate insulating film which is formed on the surface of the upper layer wiring. When there is a need to exchange a semiconductor chip mounted on a connection terminal that is provided at an end portion of a wiring such as a gate lead line or a source lead line formed of the first wiring, an ACF which was used for pressure-bonding of the semiconductor chip remains on the connection terminal even if the semiconductor chip is peeled off. To thoroughly remove the ACF, a force has to be applied to the connection terminal, but because the gate insulating film is tightly adhered to the (Continued)

molybdenum-niobium layer, the gate insulating film protecting the periphery of the connection terminal is not easily peeled off.

9 Claims, 13 Drawing Sheets

(51) Int. Cl.
    *G09G 3/36*     (2006.01)
    *H01L 27/12*     (2006.01)
    *H01L 29/49*     (2006.01)
    *G02F 1/1333*     (2006.01)
    *G02F 1/1343*     (2006.01)
    *G02F 1/1345*     (2006.01)
    *G02F 1/1362*     (2006.01)
    *G02F 1/1368*     (2006.01)
    *H01L 21/768*     (2006.01)
    *H01L 23/532*     (2006.01)
    *H01L 21/3205*     (2006.01)
    *H01L 23/522*     (2006.01)

(52) U.S. Cl.
    CPC .. *G02F 1/134336* (2013.01); *G02F 1/136286* (2013.01); *G09F 9/00* (2013.01); *G09F 9/30* (2013.01); *G09G 3/3677* (2013.01); *G09G 3/3688* (2013.01); *H01L 21/3205* (2013.01); *H01L 21/768* (2013.01); *H01L 23/522* (2013.01); *H01L 23/532* (2013.01); *H01L 27/124* (2013.01); *H01L 27/1244* (2013.01); *H01L 27/1255* (2013.01); *H01L 29/4908* (2013.01); *G02F 1/136259* (2013.01); *G02F 2001/13629* (2013.01); *G02F 2001/136295* (2013.01); *G02F 2202/28* (2013.01); *G09G 2300/0426* (2013.01); *G09G 2310/0202* (2013.01); *H01L 2924/0002* (2013.01)

(56) References Cited

U.S. PATENT DOCUMENTS

| | | | |
|---|---|---|---|
| 2006/0290274 A1* | 12/2006 | Oota | H01L 27/3211 313/506 |
| 2007/0013077 A1* | 1/2007 | Lee | H01L 23/53238 257/762 |
| 2008/0284929 A1* | 11/2008 | Kimura | G02F 1/13624 349/38 |
| 2009/0152560 A1 | 6/2009 | Yagi et al. | |
| 2011/0242476 A1* | 10/2011 | Moriwaki | G02F 1/13394 349/153 |
| 2014/0021496 A1 | 1/2014 | Higashi et al. | |
| 2014/0104688 A1 | 4/2014 | Hayashi et al. | |
| 2014/0293158 A1* | 10/2014 | Kurasawa | G06F 3/044 349/12 |
| 2015/0287799 A1 | 10/2015 | Murashige et al. | |
| 2017/0221981 A1* | 8/2017 | Tsuruoka | H01L 51/0097 |

FOREIGN PATENT DOCUMENTS

| | | |
|---|---|---|
| JP | 2005-352456 A | 12/2005 |
| JP | 2006-313231 A | 11/2006 |
| JP | 2007-294672 A | 11/2007 |
| JP | 2008-090147 A | 4/2008 |
| JP | 2014-078198 A | 5/2014 |
| WO | 2007/039954 A1 | 4/2007 |
| WO | 2013/111225 A1 | 8/2013 |
| WO | 2014/050636 A1 | 4/2014 |

OTHER PUBLICATIONS

Kimoto et al., "Display Device and Method for Manufacturing Same", U.S. Appl. No. 15/322,261, filed Dec. 27, 2016.

* cited by examiner

Fig. 1

| | STRUCTURE OF LOWER LAYER WIRING | NUMBER OF PARTICLES IMMEDIATELY AFTER DEPOSITION AVERAGE VALUE /SUBSTRATE | RESULT OF SCRATCH AND PEEL TEST PRESENCE/ABSENCE OF PEELING OF GATE INSULATING FILM | AES ANALYSIS RESULT ATOMIC RATIO OF OXYGEN AT INTERFACE BETWEEN INSULATING FILM AND Ti(TiN) |
|---|---|---|---|---|
| STUDY SAMPLE A (reference) | TiN/Al/Ti | UNCOUNTABLE (1000 or more) | ABSENT | 20~25% |
| STUDY SAMPLE B | Ti/Al/Ti | 60 | PRESENT | 40% |
| STUDY SAMPLE C | MoNb | 20 | ABSENT | ≦5% |
| STUDY SAMPLE D | MoNb/Ti/Al/Ti | 50 | ABSENT | ≦5% |

Fig. 3
(A)
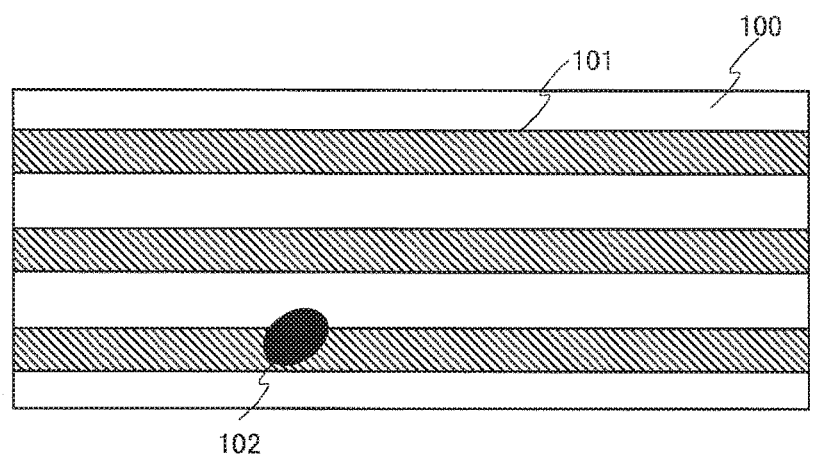
(B)
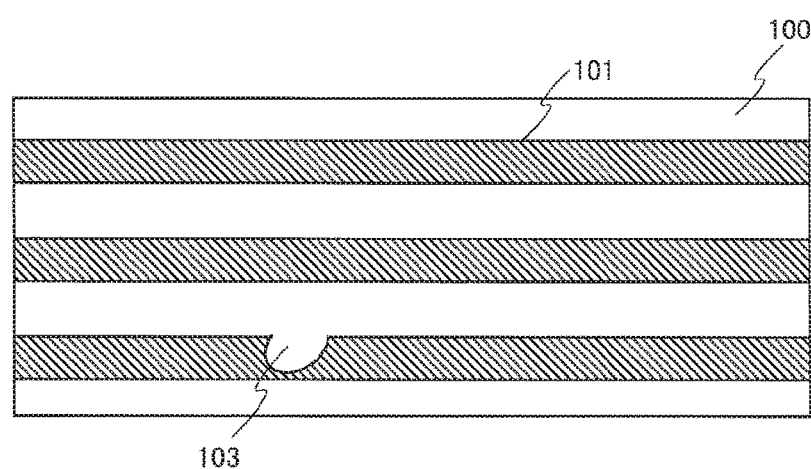
(C)
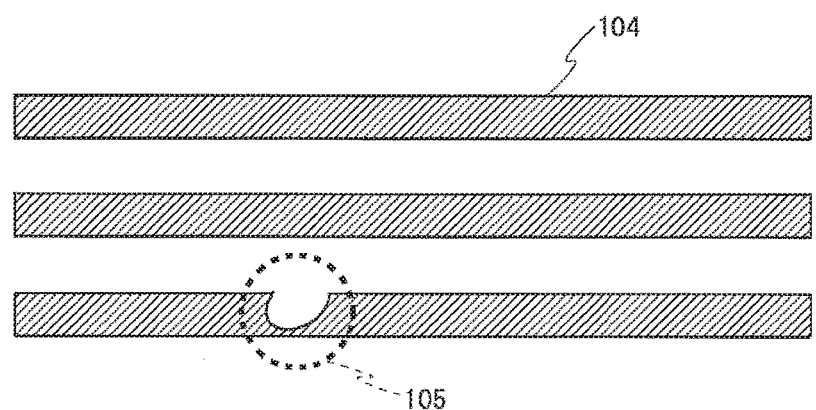

Fig. 10

|  | DRY ETCHING | WET ETCHING |
|---|---|---|
|  | CHLORINE GAS | PHOSPHORIC-NITRIC -ACETIC ACID |
| FIRST WIRING LAYER (Ti/Al/Ti) | ◯ | ✕ |
| SECOND WIRING LAYER (MoNb) | ✕ | ◯ |

METHOD FOR MANUFACTURING DISPLAY DEVICE INCLUDING A WIRING LAYER OF A MOLYBDENUM-BASED MATERIAL

TECHNICAL FIELD

The present invention relates to a display device and a method for manufacturing the same, and more particularly, to a display device including a wiring having excellent adhesion to an insulating film, and a method for manufacturing the same.

BACKGROUND ART

With a liquid crystal display device, which is widely used as a display of a portable electronic appliance in recent years, after a wiring is formed, a semiconductor chip or a semiconductor device (hereinafter collectively referred to as a "semiconductor chip") having the function of a drive circuit is mounted on a connection terminal that is provided at an edge portion of the wiring, by using an anisotropic conductive film (ACF). If it is determined at the time of inspection after mounting that the semiconductor chip is not normally operating, the mounted semiconductor chip has to be peeled off to be exchanged to another semiconductor chip. However, even after the semiconductor chip is peeled off, the ACF which was used at the time of pressure-bonding remains on the connection terminal. Accordingly, the ACF remaining on the connection terminal has to be thoroughly removed before another semiconductor chip is mounted.

At this time, if the adhesion between a metal film forming the connection terminal and an insulating film protecting the periphery of the connection terminal is poor, the insulating film around the connection terminal may be peeled off at the time of removing the ACF remaining on the connection terminal, and the reliability is reduced.

Patent Document 1 discloses forming a titanium nitride thin film on a gate electrode which is integrally formed with a scanning signal line, and improving the adhesion between the gate electrode and a gate insulating film. Because a connection terminal on which a semiconductor chip is to be mounted has the same structure as the gate electrode, the connection terminal is also tightly adhered to the gate insulating film.

Accordingly, an ACF remaining on the connection terminal after the semiconductor chip is peeled off may be removed in such a manner that an insulating film protecting the periphery of the connection terminal is not peeled off.

PRIOR ART DOCUMENT

Patent Document

[Patent Document 1] Japanese Patent Application Laid-Open No. 2004-165289

SUMMARY OF THE INVENTION

Problems to be Solved by the Invention

However, a problem as described below arises at the time of deposition of a titanium nitride film by a sputtering method. A target made of titanium is placed inside a vacuum chamber of a reactive sputtering device used for deposition of a titanium nitride film, and argon ions or the like are made to collide with the target by application of high voltage. Titanium atoms sputtered from the surface of the target react with nitrogen atoms introduced into the vacuum chamber to form titanium nitride, and collide with an insulating substrate. A titanium nitride film is thereby deposited on the surface of the insulating substrate.

At this time, the titanium nitride film is attached not only to the insulating substrate, but also to an adhesion preventive plate supporting the insulating substrate. The titanium nitride grains are extremely small, and are peeled off from the adhesion preventive plate at the time of exchange of the insulating substrate to float in the vacuum chamber, and are attached as particles when the titanium nitride film is deposited on the next insulating substrate. Accordingly, a large number of particles are attached to the titanium nitride film at the time of deposition of the titanium nitride film. At the portions where the particles are attached, a resist pattern as an etching mask is not normally formed due to the particles, and thus, a wiring formed by patterning the titanium nitride film may become narrow or disconnected, for example. Therefore, there is a problem that the reliability of a wiring may become impaired due to particles that are attached at the time of deposition of the titanium nitride film.

On the other hand, if a titanium film is deposited instead of the titanium nitride film, the number of particles to be attached to the titanium film can be significantly reduced. However, the adhesion of a titanium film to an insulating film is poor, and there is a problem that an insulating film protecting the periphery of a connection terminal is easily peeled off at the time of exchange of the semiconductor chip.

Accordingly, an object of the present invention is to provide a display device including a highly reliable wiring having excellent adhesion to an insulating film, and a method for manufacturing the same.

Means for Solving the Problems

A first aspect of the present invention is directed to a display device formed on an insulating substrate, the device including:

a display unit including a plurality of scanning signal lines formed on the insulating substrate, a plurality of data signal lines each intersecting with the plurality of scanning signal lines, and a plurality of pixel formation portions arranged in a matrix in correspondence with respective intersections of the scanning signal lines and the data signal lines;

a scanning signal line drive circuit configured to sequentially activate and select the scanning signal lines;

a data signal line drive circuit configured to apply a voltage according to image data to the data signal line; and a plurality of types of wirings connected, respectively, to the scanning signal line drive circuit and the data signal line drive circuit, wherein a wiring layer of a molybdenum-based material is formed on surfaces of at least the scanning signal lines, the data signal lines, or the plurality of types of wirings.

A second aspect of the present invention provides the display device according to the first aspect of the present invention, wherein at least the scanning signal lines, the data signal lines, or the plurality of types of wirings are wirings having a laminated structure including a lower layer wiring and an upper layer wiring, and the upper layer wiring is made of the molybdenum-based material and is formed to cover the lower layer wiring.

A third aspect of the present invention provides the display device according to the second aspect of the present invention, wherein the lower layer wiring is a single-layer wiring formed of any one of a titanium layer, a copper layer, an aluminum layer, an aluminum alloy layer, a tungsten layer, a chromium layer, and an aluminum-silicon layer.

A fourth aspect of the present invention provides the display device according to the second aspect of the present invention, wherein the lower layer wiring is a laminated wiring formed of any one of combinations: a titanium layer and an aluminum layer; a titanium layer and a copper layer; a titanium layer and an aluminum alloy layer; a titanium layer and a tungsten layer; a titanium layer and a chromium layer; a titanium layer and a tantalum layer; a copper layer and a tungsten layer; a copper layer and a chromium layer; and a copper layer and a tantalum layer, where one of the combination is provided as a lower layer and the other is provided as an upper layer.

A fifth aspect of the present invention provides the display device according to the second aspect of the present invention, wherein the lower layer wiring is a laminated wiring in which any one of an aluminum layer, a copper layer, an aluminum alloy layer, a tungsten layer, a chromium layer, a tantalum layer, and an aluminum-silicon layer is sandwiched between titanium layers on both sides.

A sixth aspect of the present invention provides the display device according to the first aspect of the present invention, wherein the plurality of types of wirings include a gate lead line connected to the scanning signal line, a source lead line connected to the data signal line, and a power line connected to the scanning signal line drive circuit, the plurality of types of wirings being formed in a same manufacturing process as the scanning signal line.

A seventh aspect of the present invention provides the display device according to the first aspect of the present invention, wherein, the plurality of types of wirings include a gate lead line connected to the scanning signal line, a source lead line connected to the data signal line, and a power line connected to the scanning signal line drive circuit, and at least one of the scanning signal line drive circuit and the data signal line drive circuit is made up of a semiconductor chip or a semiconductor device, and is pressure-bonded, using an anisotropic conductive film, to a connection terminal that is provided at an end portion of the gate lead line, the source lead line, or the power line, and that is formed in a same manufacturing process as the scanning signal line.

An eighth aspect of the present invention provides the display device according to the first aspect of the present invention, wherein the molybdenum-based material contains molybdenum-niobium or molybdenum.

A ninth aspect of the present invention provides the display device according to the eighth aspect of the present invention, wherein a film thickness of a wiring layer made of the molybdenum-based material is 30 nm to 200 nm.

A tenth aspect of the present invention provides a method for manufacturing a display device according to the first aspect of the present invention, in which at least scanning signal lines, data signal lines, or a plurality of types of wirings are wirings having a laminated structure including a lower layer wiring and an upper layer wiring, the method comprising:

a first photolithography step of forming a first resist pattern for patterning the lower layer wiring;

a first etching step for forming the lower layer wiring with the first resist pattern as a mask;

a second photolithography step of forming a second resist pattern for patterning the upper layer wiring; and a second etching step for forming the upper layer wiring with the second resist pattern as a mask, wherein, in the second photolithography step, a same photomask as a photomask that is used in the first photolithography step is used, and an amount of exposure is reduced.

Effects of the Invention

According to the first aspect described above, a wiring layer made of a molybdenum-based material, which tightly adheres to an insulating film, is formed on the surface of at least the scanning signal lines, the data signal lines, or the plurality of types of wirings connected to the scanning signal line drive circuit or the data signal line drive circuit. When there is a need to exchange a semiconductor chip mounted on a connection terminal that is provided at an end portion of a wiring, an ACF used for pressure-bonding of the semiconductor chip may remain on the connection terminal. In this case, even if a strong force is applied to remove the ACF, an insulating film protecting the periphery of the connection terminal is tightly adhered and is not easily peeled off. The reliability of the connection terminal can thereby be maintained at a high level.

According to the second aspect described above, at least the scanning signal lines, the data signal lines, or the plurality of types of wirings connected to the scanning signal line drive circuit or the data signal line drive circuit are formed of a two-layer structure including a lower layer wiring and an upper layer wiring covering the lower layer wiring, where the upper layer wiring is a wiring layer made of a molybdenum-based material. Accordingly, the upper layer wiring is tightly adhered to the insulating film that is formed on its upper surface, and the same effect as that of the first aspect is obtained. Also, the upper layer wiring has good adhesion to the lower layer wiring, and thus, the upper layer wiring is not peeled off from the lower layer wiring at the interface. Moreover, the upper layer wiring is formed to cover the lower layer wiring. Accordingly, even if the surface of the lower layer wiring is formed of a material having poor adhesion to the insulating film, adhesion between the wiring having a laminated structure and the insulating film is improved.

According to the third aspect described above, each of the lower layer wirings having a single-layer structure is a wiring made of a material having good adhesion to the upper layer wiring made of a molybdenum-based material, and thus, the lower layer wiring is tightly adhered to the upper layer wiring. Accordingly, the same effect as that of the second aspect is obtained. Also, a wiring having a laminated structure which is not easily disconnected can be realized by a simple structure by forming the lower layer wiring by a single-layer metal layer. Moreover, according to such a structure, manufacturing process of the wiring can be reduced and the material cost can be suppressed, and thus, the manufacturing cost of the wiring can be reduced.

According to the fourth aspect described above, the upper layer of the lower layer wiring having a two-layer structure is made of a material having good adhesion to the upper layer wiring made of a molybdenum-based material, and thus, the lower layer wiring is tightly adhered to the upper layer wiring. Accordingly, the same effects as those of the second and third aspects are obtained.

According to the fifth aspect described above, a top layer of the lower layer wiring having a three-layer structure is made of a material having good adhesion to the upper layer wiring made of a molybdenum-based material, and thus, the lower layer wiring is tightly adhered to the upper layer wiring. Accordingly, the same effect as that of the second aspect is obtained. Moreover, because titanium films to which only a small number of particles are attached at the time of deposition are used for the lower layer wiring, the probability that a fault pattern is formed at the time of patterning of the lower layer wiring due to particles is further reduced. The reliability of the wiring can thereby be increased. Moreover, because the metal layer of the lower layer wiring is sandwiched between the titanium layers, which are not easily etched at the time of etching of the upper layer wiring, the lower layer wiring is not easily corroded at the time of etching of the upper layer wiring. Accordingly, the reliability of the wiring can be further increased.

According to the sixth aspect described above, the plurality of types of wirings including the source lead line, the gate lead line, and the power line are formed in the same step as the scanning signal line, and thus, the connection terminals to which semiconductor chips serving as the scanning signal line drive circuit and the data signal line drive circuit are to be pressure-bonded are also formed in the same step as the scanning signal line. Therefore, the heights of the connection terminals from the insulating film are the same, and the semiconductor chips can be pressure-bonded simultaneously. Also, because the wiring is covered by an insulating film that is deposited in a later step, it is not susceptible to mechanical damage.

According to the seventh aspect described above, even if the plurality of types of wirings including the source lead line, the gate lead line, and the power line are wirings which are formed in the same step as the data signal line, the connection terminals to which the semiconductor chips serving as the scanning signal line drive circuit and the data signal line drive circuit are to be pressure-bonded are formed in the same step as the scanning signal line, and the connection terminals and the wirings are connected. Accordingly, the connection terminals are at the same height from the insulating substrate, and the semiconductor chips can be pressure-bonded simultaneously.

According to the eighth aspect described above, the molybdenum-based material contains molybdenum-niobium or molybdenum, and because these materials have good adhesion to the insulating film, the same effect as that of the first aspect can be obtained.

According to the ninth aspect described above, the film thickness of a wiring layer of the molybdenum-based material is preferably 30 nm to 200 nm. If the film thickness is less than 30 nm, deposition by a uniform film thickness becomes difficult, and if the film thickness is more than 200 nm, the throughput is reduced.

According to the tenth aspect described above, in the second photolithography step for forming a resist pattern for the upper layer wiring, the same mask as the mask that is used in the first photolithography step for forming a resist pattern for the lower layer wiring is used, and also, the amount of exposure is reduced. Accordingly, the shift in the pattern of the upper layer wiring with respect to the lower layer wiring can be reduced as much as possible, and also, the line width can be increased, and thus, the surface area of the lower layer wiring that is in contact with the insulating film can be made small. Therefore, the adhesion between the wiring and the insulating film can be improved.

BRIEF DESCRIPTION OF THE DRAWINGS

FIG. 1 is a diagram showing results of a scratch and peel test performed on various metal films.

FIGS. 3(A) to 3(C) are diagrams showing an example of an influence exerted on a wiring pattern by a particle attached to a region where a wiring is to be formed, and more particularly, FIG. 3(A) is a diagram showing a particle which is attached to a metal film and which is partially under a resist pattern, FIG. 3(B) is a diagram showing an opening formed in the resist pattern due to removal of the particle, and FIG. 3(C) is a diagram showing the shape of a wiring that is formed by etching the metal film.

FIGS. 8(A) to 8(E) are cross-sectional diagrams showing the first wiring and the second wiring in respective manufacturing steps.

FIGS. 9(F) to 9(J) are cross-sectional diagrams showing the first wiring and the second wiring in respective manufacturing steps.

FIG. 10 is a diagram showing main conditions of an etching step shown in FIG. 7.

MODES FOR CARRYING OUT THE INVENTION

0. Basic Study

Figure 2:
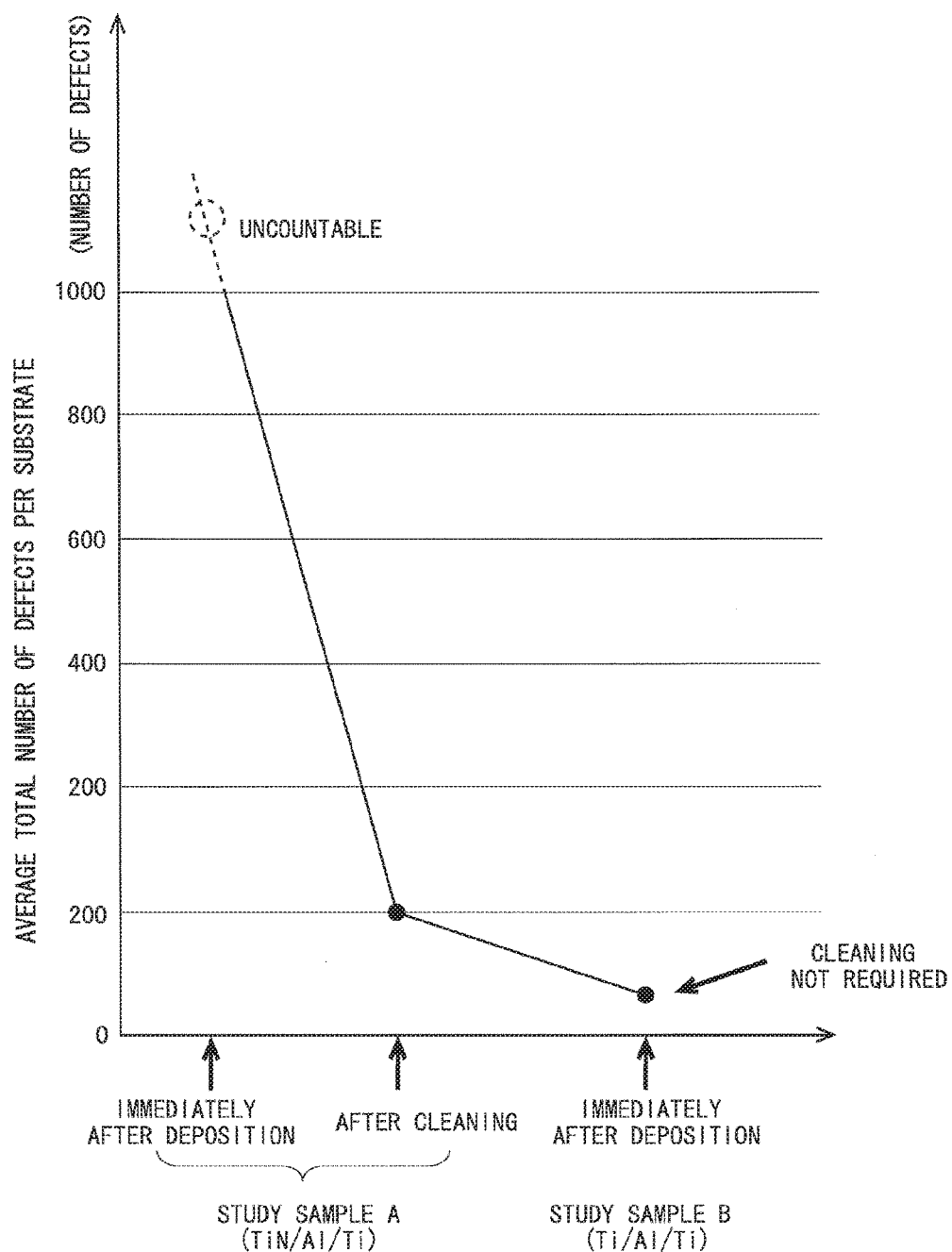
FIG. 2 is a diagram showing the total numbers of defects of a study sample A and a study sample B, each forming a lower layer wiring.

Prior to describing each embodiment of the present invention, problems related to formation of a wiring on an insulating substrate, i.e. adhesion between a metal film deposited by a sputtering method and an insulating film formed on the metal film, and the number of particles that attach to the metal film, will be described.

<0.1 Adhesion Between Metal Film and Insulating Film>

First, adhesion between a top layer metal film of a wiring formed of a laminated metal film obtained by stacking a plurality of metal films, and a gate insulating film that is formed on the metal film will be studied. The degree of adhesion is evaluated by a scratch and peel test under JIS standards. In the scratch and peel test, first, lattice grooves of 1 mm pitch are formed by a knife on a gate insulating film and a metal film in a state where the gate insulating film is deposited on the metal film. Next, an adhesive tape is stuck on the gate insulating film where the grooves are formed, and the adhesive tape is peeled off and the surface of the gate insulating film is observed by a microscope. If peeling of the gate insulating film is observed, adhesion between the metal film and the insulating film is determined to be poor, and if no peeling of the gate insulating film is observed, adhesion is determined to be good.

FIG. 1 is a diagram showing results of the scratch and peel test performed on various metal films. The scratch and peel test was performed on a total of four types of metal films, namely, a laminated metal film in which a titanium (Ti) film, an aluminum (Al) film, and a titanium nitride (TiN) film are stacked in this order from an insulating substrate side (hereinafter referred to as "titanium nitride film/aluminum film/titanium film", the same applies to other laminated metal films), laminated metal films of a titanium film/aluminum film/titanium film and a molybdenum-niobium (MoNb) film/titanium film/aluminum film/titanium film, and a single-layer metal film of only a molybdenum-titanium film. Note that, the titanium nitride film/aluminum film/titanium film is a metal film which is also cited in Patent Document 1 as having good adhesion to a gate insulating film, and is used as a reference for evaluation of the adhesion of other metal films. Also, in the description of FIGS. 1 and 2, in relation to each metal film, the titanium nitride film/aluminum film/titanium film is referred to as a "study sample A", the titanium film/aluminum film/titanium film as a "study sample B", the molybdenum-niobium film as a "study sample C", and the molybdenum-niobium film/titanium film/aluminum film/titanium film as a "study sample D", for the sake of convenience.

A gate insulating film was further formed on the surface of each of the four types of study samples A to D, and the scratch and peel test was performed. With the study sample A as the reference, there was no peeling of the gate insulating film. Similarly, there was no peeling of the gate insulating film for the study sample C and the study sample D. It was therefore found that, similarly to the study sample A, the study sample C and the study sample D have good adhesion to the gate insulating film.

Furthermore, with the study sample D, there was no peeling between the molybdenum-niobium film and the titanium film. It was therefore found that the molybdenum-niobium film has good adhesion not only to the gate insulating film, but also to the titanium film.

In contrast, with the study sample B, there was peeling of the gate insulating film. Accordingly, the adhesion between the titanium film and the gate insulating film is poor, and it is considered undesirable to form the gate insulating film on the titanium film.

Moreover, the atomic ratio of oxygen on the surface of the metal film in contact with the gate insulating film of each of the study samples A to D was measured by Auger Electron Spectroscopy (AES). As shown in FIG. 1, the atomic ratio of oxygen on the surface of the titanium nitride film was 20% to 25% for the study sample A which was determined by the scratch and peel test that there was no peeling of the insulating film, and was 5% or less for the surface of the molybdenum-niobium film of the study sample C and the study sample D. In contrast, with the study sample B, the atomic ratio of oxygen on the surface of the titanium film was higher, being 40%, compared to other study samples.

It can be said from above that adhesion between the metal film and the gate insulating film is good when the atomic ratio of oxygen on the surface of the metal film in contact with the gate insulating film is low. However, it is found that the adhesion between the gate insulating film and the metal film is reduced when the atomic ratio of oxygen on the surface of the metal film in contact with the gate insulating film is increased. Note that, the atomic ratio of oxygen on the surface of the metal film is a value which is determined by the type of metal film and which is unique to each metal film, and although it serves as an indication of the degree of adhesion, the degree of adhesion cannot be determined based solely on such a numerical value.

<0.2 Number of Particles to be Attached to Metal Film>

Next, the influence of the number of particles attached to a metal film at the time of deposition of the film exerted on the wiring of the liquid crystal display device will be considered. FIG. 2 is a diagram showing the total numbers of defects of the study sample A and the study sample B. The total numbers of defects have been measured by using an optical inspection device of Orbotech Ltd., and indicate the numbers of particles attached to the surfaces of the laminated metal films.

First, the study sample A will be studied. As shown in FIG. 2, the total number of defects immediately after formation of the study sample A was 1000/substrate or more, and exceeded the measurement limit of the optical inspection device, and thus, "uncountable" is displayed. When the study sample A was cleaned, and the total number of defects was measured again, the total number of defects was about 200/substrate, and was significantly reduced compared to immediately after the deposition of the film. This was due to removal of a large number of particles due to cleaning.

Next, the total number of defects of the laminated metal film of the study sample B immediately after deposition of the film was measured. The total number of defects was about 60/substrate, and was even smaller than the total number of defects of the study sample A after cleaning. Accordingly, it was found that cleaning immediately after deposition of the film is not necessary for the study sample B. Moreover, although not shown in FIG. 2, the total numbers of defects of the study sample C and the study sample D immediately after deposition of the films were both small, being about 20/substrate and about 50/substrate, respectively. Accordingly, it was found that cleaning immediately after deposition of the film is not necessary for the study sample C and the study sample D.

Next, an influence exerted on a wiring pattern by an attached particle will be described. FIGS. 3(A) to 3(C) are diagrams showing an example of an influence exerted on a wiring pattern by a particle attached to a region where a wiring is to be formed, and more particularly, FIG. 3(A) is a diagram showing a particle 102 which is attached to a metal film 100 and which is partially under a resist pattern 101, FIG. 3(B) is a diagram showing an opening 103 formed in the resist pattern 101 due to removal of the particle 102, and FIG. 3(C) is a diagram showing the shape of a wiring 104 that is formed by etching the metal film 100 with the resist pattern 101 as a mask.

As shown in FIG. 3(A), a particle 102 having a size of about 2 μm to 10 μm is attached to a metal film 100 deposited by the sputtering method or the like, and a resist pattern 101 as a mask for forming a wiring 104 is formed in a state where the particle 102 is attached. As shown in FIG. 3(B), the particle 102 comes off during etching for forming the wiring 104 by using the resist pattern 101 as a mask. An opening 103 is thereby formed at the position where the particle 102 was attached, and the surface of the metal film 100 which is to be the wiring 104 is exposed at the opening 103. As shown in FIG. 3(C), when etching of the metal film 100 is further performed by using the resist pattern 101 with the opening 103 as a mask, and the resist pattern 101 is stripped after the etching is ended, the width of the wiring 104 which is to have a predetermined width is narrowed at a fault portion 105. Note that, the particle 102 is a titanium nitride grain which was attached to an adhesion preventive plate at the time of deposition of the metal film 100 but was then peeled off, and its component is the same as that of the metal film 100.

Such a wiring 104 having the fault portion 105 where the width is narrowed is difficult to find by inspection before shipping of the liquid crystal display device, and the liquid crystal display device is sometimes shipped as a non-defective product. However, when a user uses the liquid crystal display device over a long period of time, if an electrical, thermal or mechanical stress or the like is repeatedly applied to the fault portion 105 where the width of the wiring 104 is narrowed, the wiring 104 may become disconnected at the narrow fault portion 105, and the liquid crystal display device may not operate normally. Note that, attached particles may come off by being washed off by a developing solution at the time of development instead of coming off by having its peripheral portion etched at the time of etching. Also in such a case, the metal film 100 which is to be the wiring 104 is etched, and the wiring 104 becomes narrow.

As described above, if a particle 102 is attached to the metal film 100 in the region where a wiring 104 is to be formed, when the metal film 100 is patterned, a partially narrowed wiring 104 may be formed, or a disconnected wiring may be formed. It can be said from the above that a smaller total number of measured defects means a smaller number of attached particles, and therefore, a lower probability of a part of the wiring being narrowed or the wiring being disconnected due to an attached particle, and the reliability of the wiring is thereby increased. Accordingly, it is desirable to form a wiring by patterning a metal film to which a small number of particles are attached at the time of deposition, such as the study samples B, C, and D.

<0.4 Summary of Basic Study>

It has been found from the result of inspecting the number of attached particles that the titanium film has a small number of particles, and it has been found from the result of inspecting the adhesion that the titanium film has poor adhesion to the gate insulating film, but the molybdenum-niobium film has good adhesion to both the gate insulating film and the titanium film. Based on these results, it is considered that, if a wiring is formed by using a laminated metal film having a molybdenum-niobium film laminated on the upper surface of a titanium film/aluminum film/titanium film to improve the adhesion to the gate insulating film and to reduce the number of attached particles, a wiring with a small number of attached particles and with good adhesion to the gate insulating film can be obtained. An embodiment of a liquid crystal display device including such a wiring will be described below.

1. First Embodiment

<1.1 Configuration of Liquid Crystal Display Device>

Figure 4:
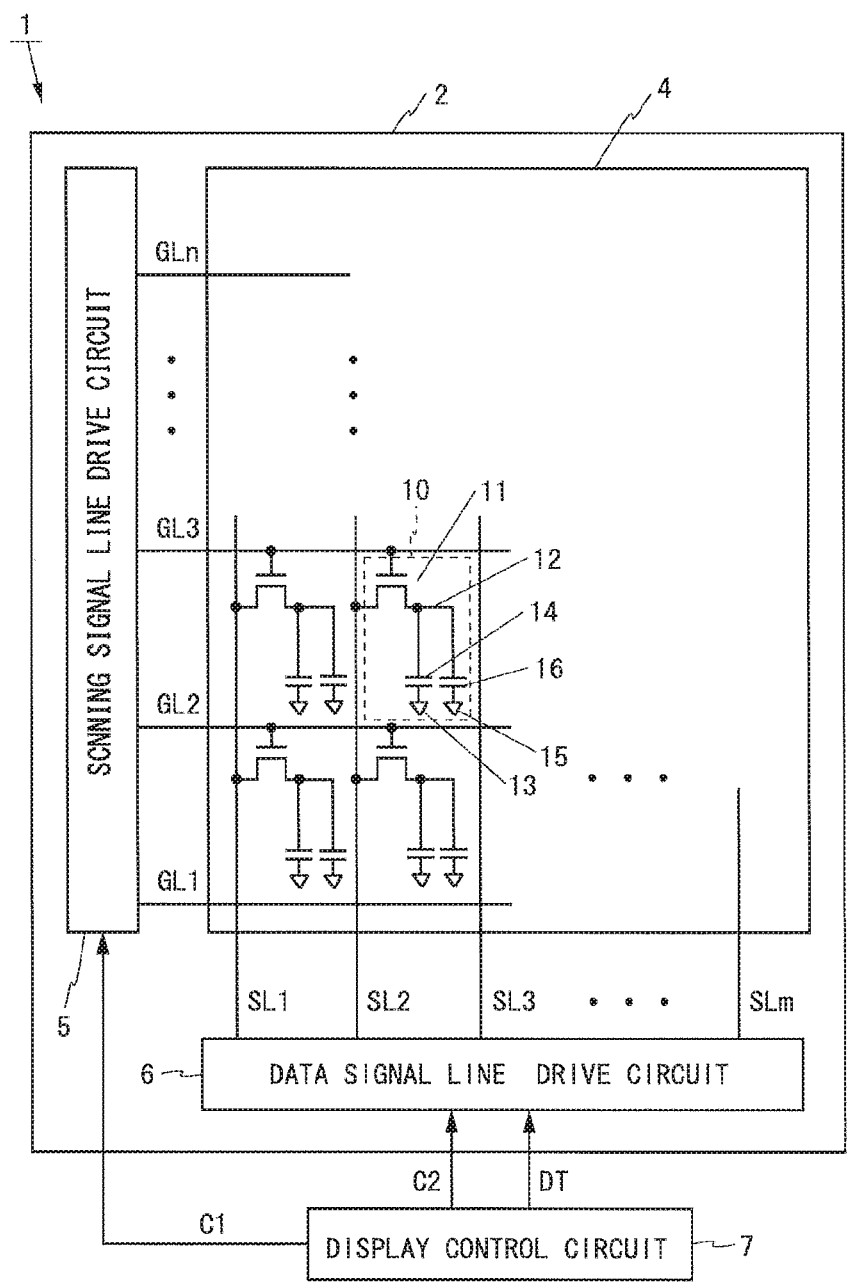
FIG. 4 is a block diagram showing a configuration of a liquid crystal display device according to a first embodiment.

FIG. 4 is a block diagram showing a configuration of a liquid crystal display device 1 according to the first embodiment. As shown in FIG. 4, the liquid crystal display device 1 is an active matrix-type display device including, on an insulating substrate (array substrate) 2, a display unit 4, a scanning signal line drive circuit 5, a data signal line drive circuit 6, and a display control circuit 7.

The display unit 4 is provided with a plurality (m) of data signal lines SL1 to SLm, a plurality (n) of scanning signal lines GL1 to GLn, and a plurality (m×n) of pixel formation portions 10 provided in correspondence with respective intersections of the m data signal lines SL1 to SLm and the n scanning signal lines GL1 to GLn. The pixel formation portions 10 are arranged two-dimensionally, m in the row direction and n in the column direction. The scanning signal line Gi is commonly connected to the pixel formation portions 10 arranged at an i-th row, and the data signal line SLj is commonly connected to the pixel formation portions 10 arranged at a j-th column. Note that, m and n are integers of two or more.

Each pixel formation portion 10 includes a thin film transistor (sometimes referred to as "TFT") 11 having a gate electrode connected to the scanning signal line GLi passing through a corresponding intersection and a source electrode connected to the data signal line SLj passing through the intersection, a pixel electrode 12 connected to a drain electrode of the TFT 11, a common electrode 13 commonly provided to the m×n pixel formation portions 10, and a liquid crystal layer (not shown) sandwiched between the pixel electrode 12 and the common electrode 13 and commonly provided to the plurality of pixel formation portions 10, and the pixel electrode 12, the common electrode 13, and the liquid crystal layer form a pixel capacitance 14. Furthermore, in many cases, to reliably retain voltage (a source signal) according to image data, an auxiliary capacitance 16 formed of the pixel electrode 12, an auxiliary capacitance line 15, and the liquid crystal layer is provided in parallel to the pixel capacitance 14.

Based on a control signal and image data supplied from outside, the display control circuit 7 outputs a control signal C1 to the scanning signal line drive circuit 5, and outputs a control signal C2 and image data DT to the data signal line drive circuit 6. The scanning signal line drive circuit 5 sequentially outputs high-level clock signals GCK, one at a time to the scanning signal lines GL1 to GLn. Accordingly, the scanning signal lines GL1 to GLn supplied with the high-level clock signals GCK are sequentially selected and activated one at a time, and the pixel formation portions 10 of one row connected to a selected scanning signal line GLi are placed in a state where collective writing of a source signal according to the image data DT is enabled. The data signal line drive circuit 6 is controlled by the control signal C2, and applies a source signal according to the image data DT to the data signal lines SL1 to SLm. Accordingly, a source signal is written in the pixel formation portions 10 of one row connected to the selected scanning signal line GLi. The liquid crystal display device 1 thus displays an image.

Figure 5:
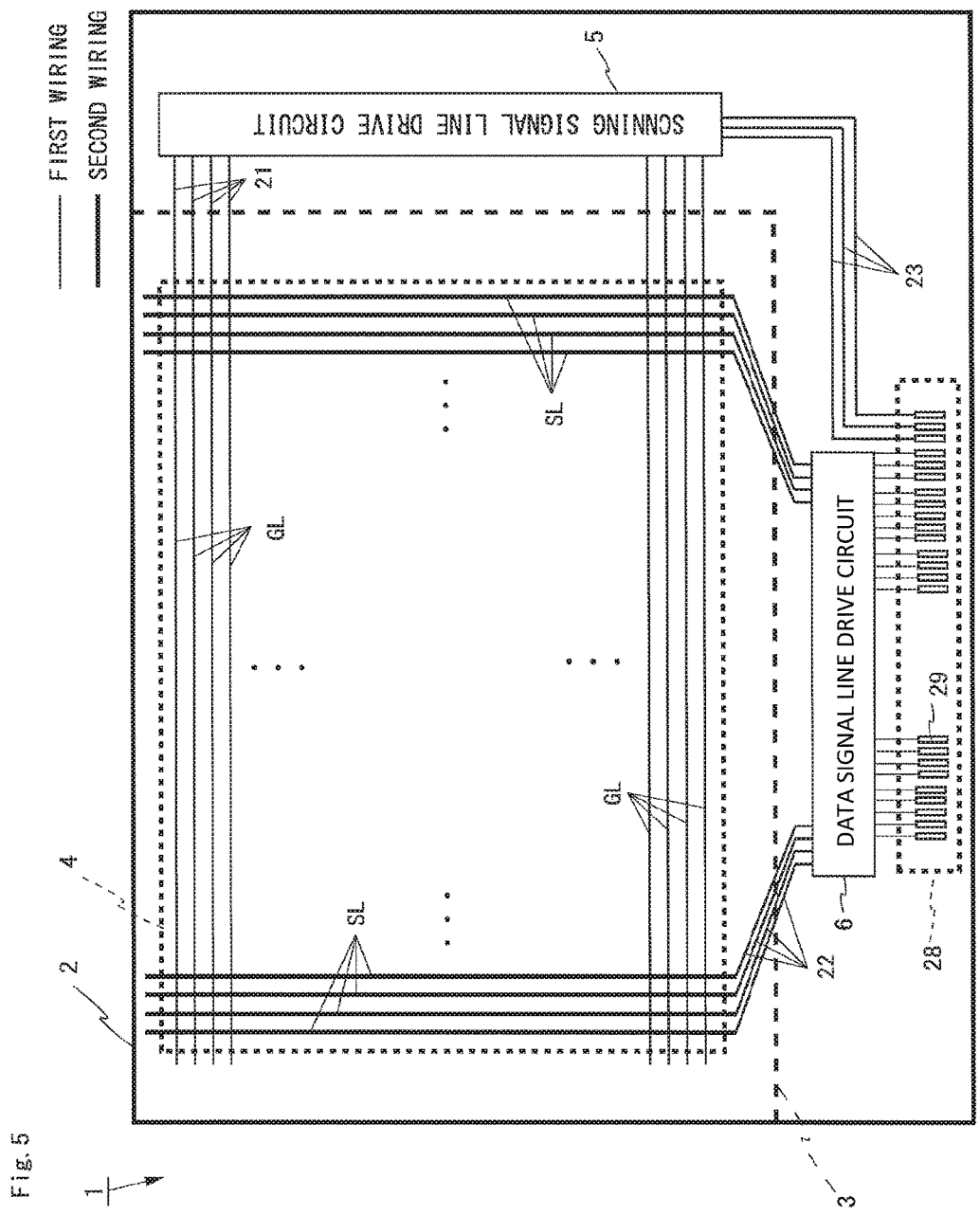
FIG. 5 is a plan view showing an arrangement of wirings formed in the liquid crystal display device shown in FIG. 4.

FIG. 5 is a plan view showing an arrangement of wirings formed in the liquid crystal display device 1. As shown in FIG. 5, the liquid crystal display device 1 has an array substrate 2, such as a glass plate, and a counter substrate 3 which are stuck together, and the display unit 4 for displaying images, texts and the like is provided at a center portion. The display unit 4 is provided with a plurality of scanning signal lines GL formed in the horizontal direction, a plurality of data signal lines SL formed in the vertical direction, and pixel formation portions (not shown) formed at the intersections.

The scanning signal line drive circuit 5 for driving the scanning signal lines GL and the data signal line drive circuit 6 for driving the data signal lines SL are disposed at a region called the frame of the array substrate 2 where the counter substrate 3 is not stuck. The scanning signal line drive circuit 5 and the data signal line drive circuit 6 may be monolithically formed with the display unit 4, or each output terminal of semiconductor chips having these functions may be pressure-bonded to a connection terminal provided to an end portion of each wiring by using the ACF. In FIG. 5, the scanning signal lines GL are sequentially activated by the scanning signal line drive circuit 5 which is a semiconductor chip mounted on the frame on the right side of the display unit 4, and a source signal as a voltage according to the image data DT is applied to each data signal line SL by the data signal line drive circuit 6 which is a semiconductor chip mounted on the frame on the lower side of the display unit 4. The image data DT and the control signals C1 and C2 are supplied to the scanning signal line drive circuit 5 and the data signal line drive circuit 6 from an external display control circuit (not shown) via respective FPC (flexible printed circuit) connection terminals 29 provided in a connection portion 28, provided on the array substrate 2.

A wiring that is formed on such a liquid crystal display device 1 will be described. Gate lead lines 21 for connecting the scanning signal line drive circuit 5 and respective scanning signal lines GL, source lead lines 22 for connecting the data signal line drive circuit 6 and respective data signal lines SL, and power lines 23 for supplying power source voltage and various control signals to the scanning signal line drive circuit 5 are formed on the array substrate 2. Each of these wirings 21 to 23 is formed simultaneously at the time of forming the scanning signal line GL or the data signal line SL. Accordingly, in the present specification, the scanning signal line GL and the wiring that is formed simultaneously at the time of forming the scanning signal line GL will be referred to as a "first wiring", and the data signal line SL and the wiring that is formed simultaneously at the time of forming the data signal line SL will be referred to as a "second wiring".

The first wiring includes the scanning signal line GL, the gate lead line 21, the source lead line 22, and the power line 23, and in the case of a liquid crystal display device of a vertical electric field method, an auxiliary capacitance line (not shown) is further included. On the other hand, the second wiring includes the data signal line SL. Here, the scanning signal line GL is integrally formed with the gate electrode of the TFT 11, and the entire scanning signal line GL including the gate electrode is the first wiring. Also, in the case where the scanning signal line drive circuit 5 and the data signal line drive circuit 6 are monolithically formed, the scanning signal line drive circuit 5 and the data signal line drive circuit 6 are configured by a wiring formed in the same step as the first wiring, and a wiring formed in the same step as the second wiring. The wirings 21 to 23, which correspond to the first wiring, are covered by insulating films such as the gate insulating film and a passivation film which are formed later. Accordingly, the wirings 21 to 23 have increased environmental resistance, such as moisture resistance, and are less susceptible to mechanical damage, such as a scratch.

Note that, the source lead line 22 may be formed simultaneously with the data signal line SL. In this case, the heights, from the array substrate 2, of connection terminals formed at respective end portions of the gate lead line 21 and the source lead line 22 are different. If a semiconductor chip serving as the scanning signal line drive circuit 5 and a semiconductor chip serving as the data signal line drive circuit are pressure-bonded simultaneously to the connection terminals at different heights, the pressure-bonding strength becomes different between the semiconductor chips, causing connection resistance values to be varied. Accordingly, in the case of forming the source lead line 22 simultaneously with the data signal line SL, which is the second wiring, a connection terminal for pressure-bonding the semiconductor chip serving as the data signal line drive circuit 6 has to be formed simultaneously with the scanning signal line GL, and the source lead line 22 formed simultaneously with the data signal line SL has to be connected to the connection terminal.

It can be understood from the basic study that a wiring having a wiring structure of the study sample D, in which a molybdenum-niobium film is formed on a laminated metal film of titanium film/aluminum film/titanium film is highly reliable and has good adhesion to the gate insulating film. Accordingly, a wiring structure of a first wiring 40 according to the present embodiment will be described based on the result of the basic study. In the following, for the convenience of description, out of the wirings forming the first wiring 40, a wiring formed of the titanium film/aluminum film/titanium film will be referred to as a lower layer wiring 41, and a wiring formed of the molybdenum-niobium film will be referred to as an upper layer wiring 42.

Figure 6:
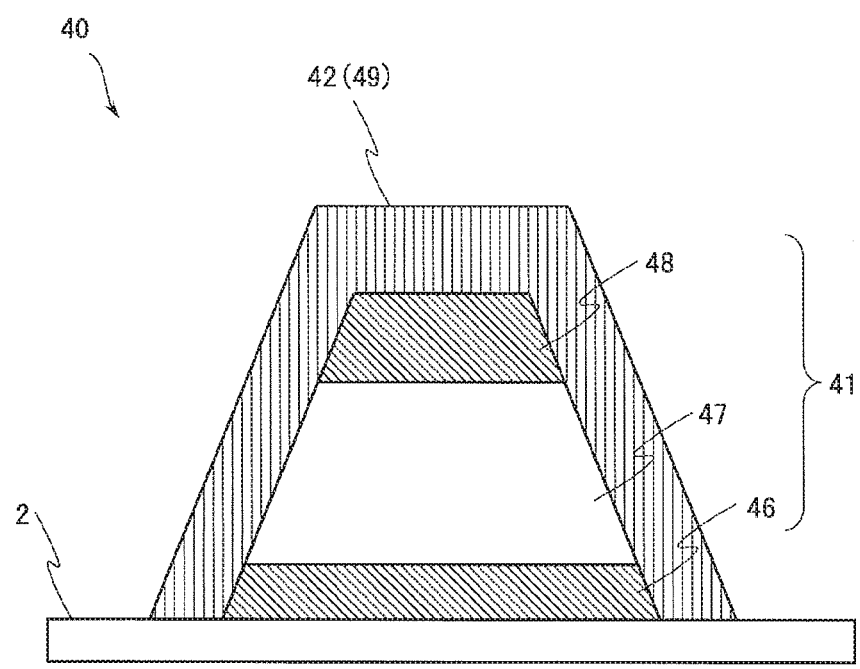
FIG. 6 is a cross-sectional diagram showing a cross-section of a first wiring shown in FIG. 5.

FIG. 6 is a cross-sectional diagram showing the structure of the first wiring 40. As shown in FIG. 6, the first wiring 40 includes, on the array substrate 2, the lower layer wiring 41 and the upper layer wiring 42 formed to cover the surface of the lower layer wiring 41. The lower layer wiring 41 has a laminated structure in which a first titanium layer 46, an aluminum layer 47, and a second titanium layer 48 are stacked in this order from the array substrate 2 side, and the upper layer wiring 42 is a wiring having a single-layer structure formed of a molybdenum-niobium layer 49. In the lower layer wiring 41, sandwiching the aluminum layer 47 between the first and second titanium layers 46, 48 prevents occurrence of hillock at the aluminum layer 47 or prevents aluminum atoms from diffusing from the aluminum layer 47 to a channel layer of the TFT and affecting the property of the TFT.

According to the result of the basic study, when depositing a titanium film or a molybdenum-niobium film by the sputtering method, the number of particles that are attached to the titanium film or the molybdenum-niobium film is smaller compared to the case of depositing a titanium nitride film. Therefore, when forming the lower layer wiring 41 or the upper layer wiring 42, the lower layer wiring 41 or the upper layer wiring 42 is prevented from becoming narrow or from being disconnected due to particles, and the reliability of the first wiring 40 is increased.

Furthermore, not only is the number of particles that are attached during deposition of a metal film is reduced, but the positions where the particles are attached are random, and thus, the possibility that the positions of particles attached to the titanium film and the positions of particles attached to the molybdenum-niobium film are the same is quite low. In this case, even if one of the second titanium layer 48 and the molybdenum-niobium layer 49 is disconnected due to a particle, the other is highly likely to be normal. Accordingly, conductivity of the first wiring 40 is maintained through the normal wiring, and thus, a highly reliable wiring may be realized.

Furthermore, the molybdenum-niobium layer 49 having good adhesion to an insulating film is formed on the surface of the first wiring 40. Accordingly, if a gate insulating film of a silicon nitride film is formed on the first wiring 40, the gate insulating film will have good adhesion to the molybdenum-niobium layer 49. This prevents the gate insulating film from being easily peeled off from the first wiring 40. Moreover, the molybdenum-niobium layer 49 also has good adhesion to the second titanium layer 48, and thus, the molybdenum-niobium layer 49 is not easily peeled off from the second titanium layer 48 at the interface. Note that, the gate insulating film is not limited to the silicon nitride film, and may alternatively be a silicon oxide film.

The semiconductor chips serving as the scanning signal line drive circuit 5 and the data signal line drive circuit 6 are pressure-bonded to the connection terminals provided at the end portions of wirings such as the gate lead line 21 and the source lead line 22 by using the ACFs. The structure of such a connection terminal is the same as the wiring structure of the first wiring 40, and thus, also at the connection terminal, the gate insulating film is tightly adhered to the molybdenum-niobium layer 49, which is the top layer of the connection terminal. Accordingly, the gate insulating film protecting the periphery of the connection terminal is not easily peeled off from the connection terminal even if a force is applied to the connection terminal at the time of peeling off the semiconductor chip which is pressure-bonded to the connection terminal and exchanging to another semiconductor chip or at the time of removing the ACF remaining on the connection terminal.

Note that, the lower layer wiring 41 of the first wiring 40 is tapered on both sides. Furthermore, the upper layer wiring 42 formed of the molybdenum-niobium layer 49 is formed to cover the upper surface and both side surfaces of the lower layer wiring 41, and the upper layer wiring 42 is also tapered on both sides in the same manner as the lower layer wiring 41, and its taper angle is the same as the taper angle of the lower layer wiring 41. The lower layer wiring 41 and the upper layer wiring 42 forming the first wiring 40 are tapered on both sides in the above manner so as to prevent step-cut, due to poor step coverage on the side surfaces of the first wiring 40, of an insulating film such as the gate insulating film that is formed to cover the first wiring 40 after formation of the first wiring 40.

The wiring structure of the second wiring is the same as the wiring structure of the first wiring 40 shown in FIG. 6, and thus, a cross-sectional diagram of the second wiring is omitted. Similarly to the wiring structure of the first wiring 40, the wiring structure of the second wiring also includes a lower layer wiring having a laminated structure in which a first titanium layer, an aluminum layer, and a second titanium layer are stacked in this order from the array substrate 2 side, and an upper layer wiring which is a molybdenum-niobium layer which is formed to cover the surface of the lower layer wiring. Accordingly, also in the case of the second wiring, as in the case of the first wiring, even if a force is applied to the molybdenum-niobium layer of a connection terminal to peel off a semiconductor chip or to remove an ACF, the insulating film is not easily peeled off because the molybdenum-niobium layer and an insulating film (passivation film) are tightly adhered to each other. Moreover, to prevent step-cut of the insulating film, the lower layer wiring and the upper layer wiring are tapered on both sides.

<1.2 Method for Manufacturing Wiring>

Figure 7:
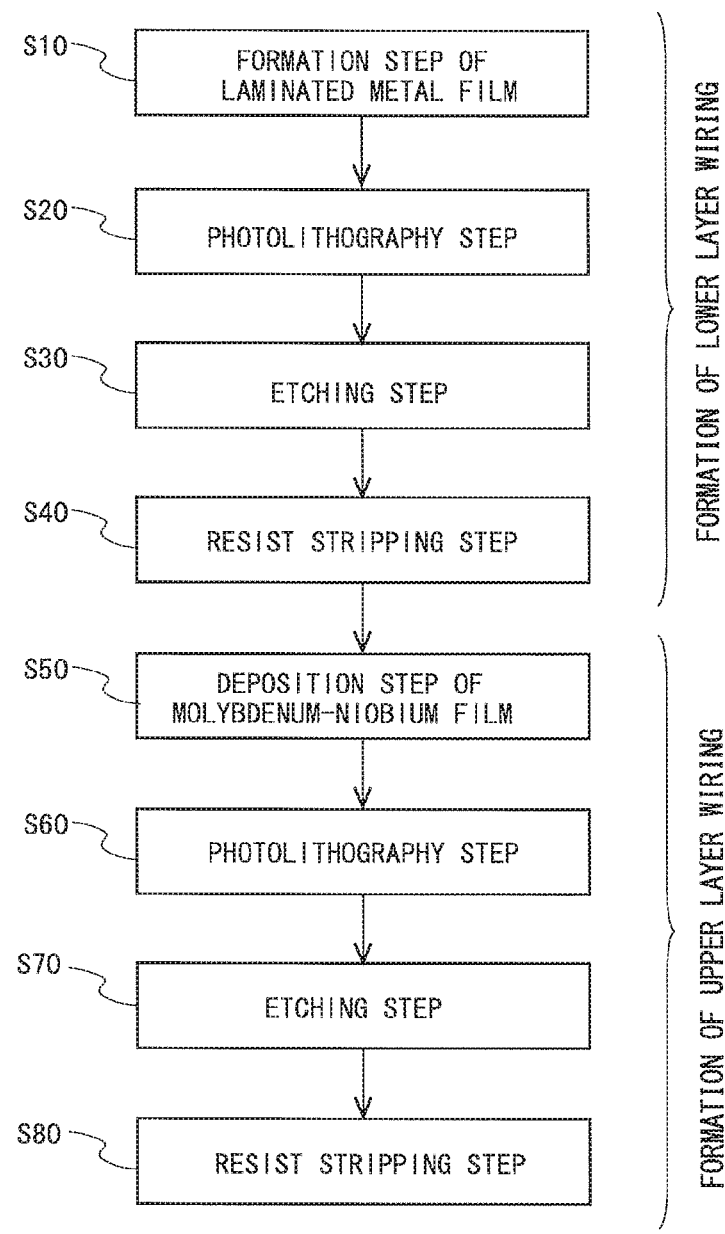
FIG. 7 is a flowchart showing manufacturing process of the first wiring shown in FIG. 5.
Figure 8:
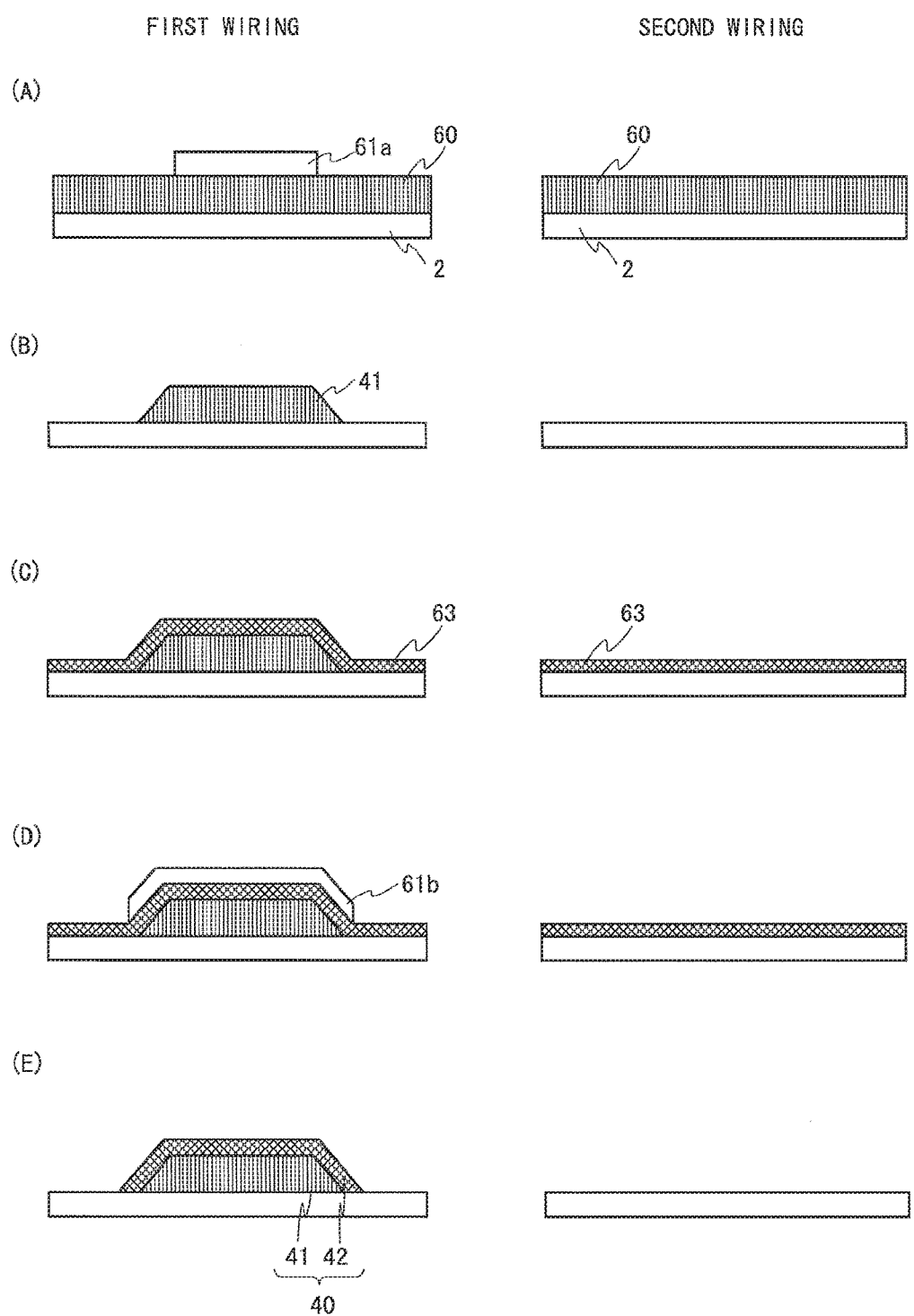
FIGS. 8(A) to 8(E) are cross-sectional diagrams showing manufacturing process of the first wiring and a second wiring shown in FIG. 5, and more particularly.
Figure 9:
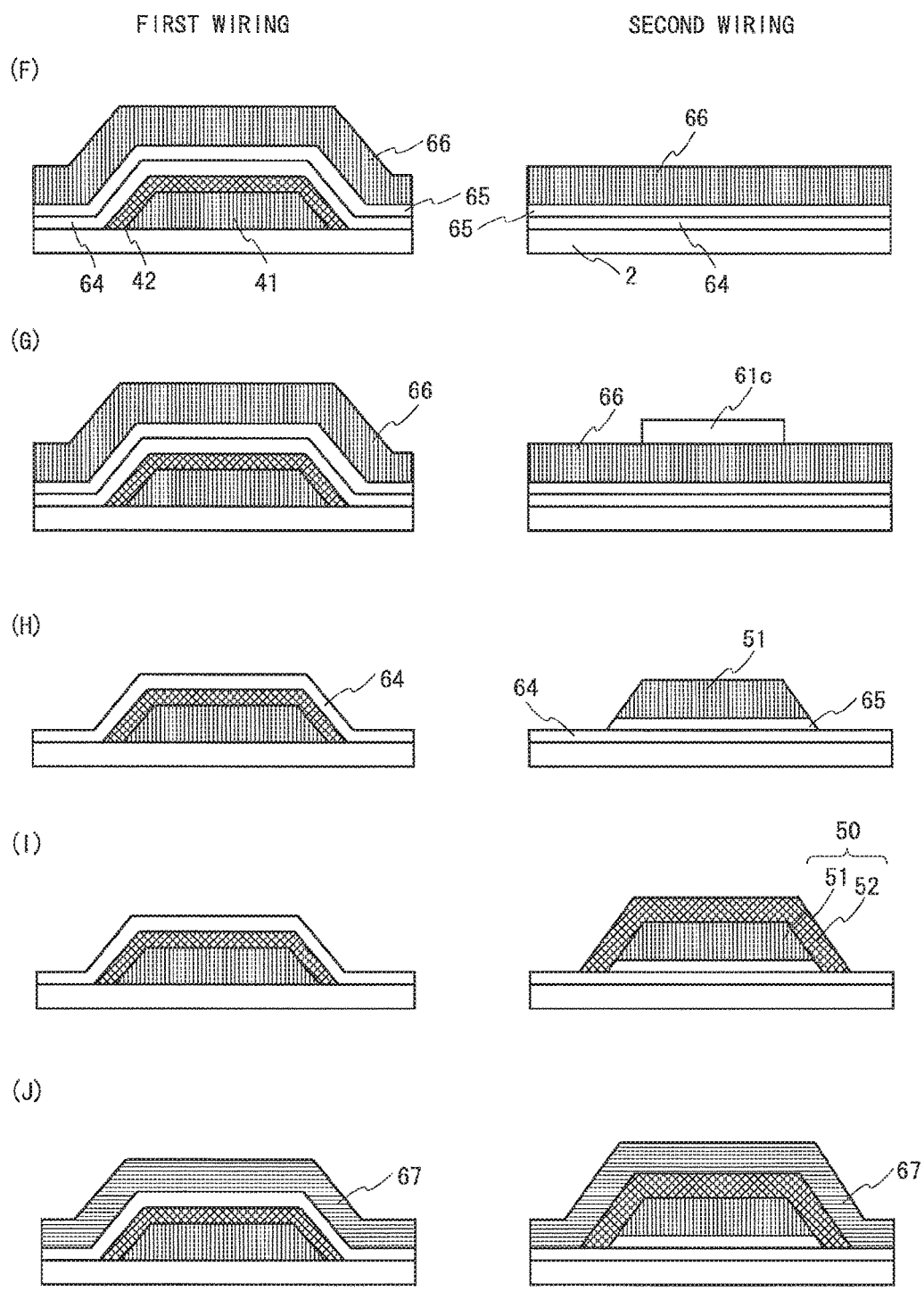
FIGS. 9(F) to 9(J) are cross-sectional diagrams showing manufacturing process of the first wiring and the second wiring shown in FIG. 5, and more particularly.

Next, a method for manufacturing the first wiring 40 and a second wiring 50 having the wiring structure described above will be described. FIG. 7 is a flowchart showing manufacturing process of the first wiring 40 of the present embodiment. Also, FIGS. 8(A) to 8(E) and FIGS. 9(F) to 9(J) are cross-sectional diagrams showing manufacturing process of the first wiring 40 and the second wiring 50, and more particularly, FIGS. 8 (A) to 8(E) and FIGS. 9(F) to 9(J) are cross-sectional diagrams of the first wiring 40 and the second wiring 50 in respective manufacturing steps. Furthermore, FIG. 10 is a diagram showing main conditions of etching steps in step S30 and step S70 shown in FIG. 7. Note that, in each of FIGS. 8(A) to 8(E) and FIGS. 9(F) to 9(J), a cross-section of the first wiring 40 is shown on the left side, and a cross-section of the second wiring 50 is shown on the right side. In the following, the method for manufacturing the first wiring 40 and the second wiring 50 will be described with reference to FIGS. 7 to 10.

First, an outline of manufacturing process of the first wiring 40 will be given with reference to FIG. 7. As shown in FIG. 7, in a formation step of a laminated metal film in step S10, a laminated metal film is formed by depositing a titanium film, an aluminum film, and a titanium film in this order. In a photolithography step in step S20, a resist pattern is formed on the surface of a laminated metal film which is to be the lower layer wiring 41 of the first wiring 40. In an etching step in step S30, the laminated metal film is etched by using a dry etching method, and the lower layer wiring 41 is formed. In a resist stripping step in step S40, the resist pattern formed in step S20 is stripped. The lower layer wiring 41 is formed by the steps up to this point.

Next, in a deposition step of a molybdenum-niobium film in step S50, a molybdenum-niobium film which is to be the upper layer wiring 42 of the first wiring 40 is deposited. In a photolithography step in step S60, a resist pattern is formed on the surface of the molybdenum-niobium film. The photomask used in the photolithography step is the same mask as the photomask that is used in the photolithography step in step S20. However, the amount of exposure in step S60 is smaller than that in step S20.

In an etching step in step S70, the molybdenum-niobium film is etched by using a wet etching method, and the upper layer wiring 42 is formed. In the etching, an etchant with a high selection ratio (etching speed) between the molybdenum-niobium film and the titanium film is used. Accordingly, the titanium film is hardly etched in a period until the end of etching of the molybdenum-niobium film. In a resist stripping step in step S80, the resist pattern formed in step S60 is stripped. The upper layer wiring 42 is formed by the steps from step S50 to step S80. Note that, the second wiring is formed by repeating the same steps as steps S10 to S80 described above, and description thereof is omitted.

Next, the method for manufacturing the first and second wirings 40, 50 will be described with reference to FIGS. 8(A) to 8(E) and FIGS. 9(F) to 9(J). First, as shown in FIG. 8(A), a laminated metal film 60 is formed by depositing metal films, i.e., a titanium film, an aluminum film, and a titanium film, each having a predetermined film thickness, on the array substrate 2 in this order by using the sputtering method. A positive resist is coated on the laminated metal film 60, and a resist pattern 61a is formed by performing exposure by using a photomask and development. At this time, to taper the side surfaces of the lower layer wiring 41, post-baking is performed at the time of formation of the resist pattern 61a under the condition of tapering end portions. As shown in FIG. 8(B), the metal films forming the laminated metal film 60 are sequentially etched by the dry etching method with the resist pattern 61a as the mask. As shown in FIG. 10, this etching is performed under a known etching condition that mainly uses chlorine gas, and then, the resist pattern 61a is stripped. The lower layer wiring 41 of the first wiring 40 is thus formed. In this etching, polymer that is generated at the time of etching is accumulated at side walls simultaneously with the etching of the laminated metal film 60, and thus, the lower layer wiring 41 becomes tapered on the side surfaces. Note that, the laminated metal film 60 including a titanium film, an aluminum film, and a titanium film is also formed at a region where the second wiring 50 is to be formed. However, because a resist pattern is not formed on the laminated metal film 60, the laminated metal film 60 is removed at the time of dry etching, and the surface of the array substrate 2 is exposed.

Next, as shown in FIG. 8(C), a molybdenum-niobium film 63 is deposited by the sputtering method. At this time, the molybdenum-niobium film 63 is deposited also in the region where the second wiring 50 is to be formed. Note that, the film thickness of the molybdenum-niobium film 63 is 30 nm to 200 nm. If the film thickness is less than 30 nm, deposition by a uniform film thickness becomes difficult, and if the film thickness is more than 200 nm, the throughput is reduced.

As shown in FIG. 8(D), a positive resist is coated on the molybdenum-niobium film 63, and a resist pattern 61b is formed by performing exposure by using a photomask. The photomask used at this time is the same photomask as the photomask used for forming the resist pattern 61a in FIG. 8(A). However, the line width of the resist pattern 61b has to be made wide so that the resist pattern 61b after exposure/development covers the surface of the lower layer wiring 41. Accordingly, exposure is performed with a smaller amount of exposure than in the case of FIG. 8(A). At this time, a resist pattern is not formed on the molybdenum-niobium film 63 which is deposited in a region where the second wiring 50 is to be formed.

Next, as shown in FIG. 8(E), the molybdenum-niobium film 63 is etched with the resist pattern 61b as the mask, and the upper layer wiring 42 is formed. As shown in FIG. 10, the etching for forming the upper layer wiring 42 is wet etching that is performed by using a known phosphoric-nitric-acetic acid aqueous solution in which phosphoric acid ($H_3PO_4$), nitric acid ($HNO_3$), and acetic acid ($CH_3COOH$) are mixed in a predetermined ratio. With the phosphoric-nitric-acetic acid aqueous solution, the etching speed of the molybdenum-niobium film 63 of the upper layer wiring 42 is sufficiently greater than the etching speed of the titanium layer of the lower layer wiring 41 (i.e. the selection ratio is high), and the titanium layer that is exposed on the surface of the lower layer wiring 41 is hardly etched at the time of etching of the molybdenum-niobium film 63. The resist pattern 61b is then stripped.

The upper layer wiring 42 that is electrically connected to the lower layer wiring 41 and that covers the entire surface of the lower layer wiring 41 is thus formed. In this case, the molybdenum-niobium film 63 is deposited along the surface of the lower layer wiring 41, and thus, the upper layer wiring 42 is also tapered on both sides, and its taper angle is the same as the taper angle of the lower layer wiring 41. In this wet etching, the molybdenum-niobium film 63 at the region where the second wiring 50 is to be formed is removed, and the surface of the array substrate 2 is exposed again. The first wiring 40 is formed by the steps up to this point.

Next, as shown in FIG. 9(F), a gate insulating film 64 of a silicon nitride film and the like, and a semiconductor film 65 which is to be a channel layer of a TFT are deposited in this order by a plasma chemical vapor deposition (CVD) method. These films are formed to cover the first wiring 40 at the region where the first wiring 40 is formed, and are stacked on the array substrate 2 at the region where the second wiring 50 is to be formed. The gate insulating film 64 is thus formed on the upper surface of the upper layer wiring 42 of the first wiring 40. Note that, a silicon oxide film may be deposited as the gate insulating film 64, instead of the silicon nitride film.

Furthermore, a laminated metal film 66 is formed on the semiconductor film 65 by using the sputtering method, the laminated metal film 66 including metal films, i.e., a titanium film, an aluminum film, and a titanium film, each having a predetermined film thickness, deposited in this order. Then, the same steps as the steps in FIGS. 8(A) to 8(E) described above are repeated. The second wiring 50 including a lower layer wiring 51 and an upper layer wiring 52 formed to cover the surface of the lower layer wiring 51 is thereby formed on the gate insulating film 64 by sandwiching the semiconductor film in-between as shown in FIG. 9(I).

Then, a step for forming the TFT, and a step for forming a passivation film 67 for protecting the display unit and each wiring from the external environment are performed, and the liquid crystal display device 1 is manufactured. Note that, these steps are steps that are not directly relevant to the present invention, and detailed description thereof is omitted. The first wiring 40 covered by the gate insulating film 64 and the passivation film 67, and the second wiring 50 covered by the passivation film 67 are thus formed.

Note that, in the present embodiment, it is preferable that the upper layer wiring 42 is formed to entirely cover the lower layer wiring 41 so as to increase the contact area between the gate insulating film 64 and the molybdenum-niobium layer 49 with good adhesion. However, if the position of the resist pattern 61b for forming the upper layer wiring 42 is shifted in the line width direction in the step shown in FIG. 8(D), the gate insulating film 64 is not only brought into contact with the molybdenum-niobium layer 49, but also brought into contact with the second titanium layer 48. In this case, because adhesion between the second titanium layer 48 and the gate insulating film 64 is poor according to the result of the basic study, adhesion between the first wiring 40 and the gate insulating film 64 is reduced.

Figure 11:
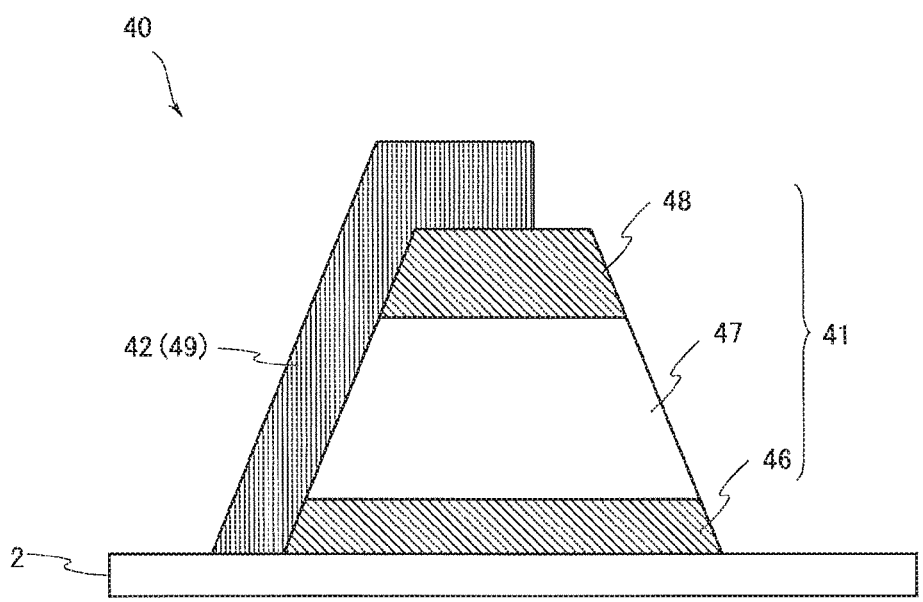
FIG. 11 is a cross-sectional diagram of a first wiring in which a molybdenum-niobium layer is formed shifted with respect to a second titanium layer.

FIG. 11 is a cross-sectional diagram of the first wiring 40 in which the molybdenum-niobium layer 49 is formed shifted with respect to the second titanium layer 48. As shown in FIG. 11, to prevent reduction in the adhesion between the first wiring 40 and the gate insulating film 64, the molybdenum-niobium layer 49 has to be formed to cover at least 50% of the line width of the second titanium layer 48 even when the molybdenum-niobium layer 49 is shifted with respect to the second titanium layer 48. Accordingly, as described above, the photomask used at the time of forming the resist pattern for the lower layer wiring 41 including the second titanium layer 48 is used as the photomask for forming the resist pattern for the molybdenum-niobium layer 49, and the amount of exposure is reduced compared to the amount of exposure at the time of forming the resist pattern for the lower layer wiring 41. Accordingly, the shift in the pattern of the molybdenum-niobium layer 49 with respect to the lower layer wiring 41 is reduced as much as possible, and the line width of the resist pattern for forming the molybdenum-niobium layer 49 is increased, and thus, the surface area of the second titanium layer 48 that is in contact with the gate insulating film 64 can be made small. Therefore, the adhesion between the first wiring 40 and the gate insulating film 64 can be improved.

In the description above, the second wiring 50 is, similarly to the first wiring 40, described as having two layers, i.e., the lower layer wiring 51 and the upper layer wiring 52, where the upper layer wiring 52 is a wiring that covers the entire surface of the lower layer wiring 51. However, the second wiring 50 may alternatively be a wiring having a single-layer structure including a metal layer which is the same as the metal layer forming the source/drain electrodes of the TFT, for example.

<1.4 Effects>

According to the present embodiment, the upper layer wiring 42, which is formed of the molybdenum-niobium layer 49 of the first wiring 40, has good adhesion to the gate insulating film 64 formed on the upper surface of the upper layer wiring 42. When there is a need to exchange a semiconductor chip that is mounted on a connection terminal that is provided at an end portion of a wiring such as the gate lead line 21, the source lead line 22, or the power line 23 formed of the first wiring 40, the ACF used for pressure-bonding of the semiconductor chip remains on the connection terminal even if the semiconductor chip is peeled off. To thoroughly remove the ACF, a force has to be applied to the connection terminal, but because the gate insulating film 64 is tightly adhered to the molybdenum-niobium layer 49, the gate insulating film 64 protecting the periphery of the connection terminal is not easily peeled off even when the force is applied. The reliability of the wiring including the connection terminal can thereby be maintained at a high level. Furthermore, because the adhesion of the molybdenum-niobium layer 49 to the second titanium layer 48 is good, the molybdenum-niobium layer 49 is not easily peeled off from the lower layer wiring 41.

Furthermore, the first wiring 40 is a wiring having a two-layer structure formed of the lower layer wiring 41 including the second titanium layer 48 instead of a titanium nitride layer, and the upper layer wiring 42 including the molybdenum-niobium layer 49 formed to cover the surface of the lower layer wiring 41. Compared to a titanium nitride film, the number of particles that are attached at the time of deposition is significantly reduced for the titanium film and the molybdenum-niobium film 63. Accordingly, parts that are narrowed or disconnected due to particles attached to the titanium film are significantly reduced at the time of formation of the lower layer wiring 41, and also, parts that are narrowed or disconnected due to particles attached to the molybdenum-niobium film 63 are significantly reduced at the time of formation of the upper layer wiring 42. Furthermore, the probability is extremely low that parts of the lower layer wiring 41 and the upper layer wiring 42 where the line width is narrowed are formed at the same position. Accordingly, even if one of the lower layer wiring 41 and the upper layer wiring 42 is disconnected, the conductivity of the first wiring 40 is maintained through the other wiring, and the reliability of the first wiring 40 is greatly increased.

Moreover, to improve the adhesion between the first wiring 40 and the gate insulating film 64, the contact area between the molybdenum-niobium layer 49 and the gate insulating film 64 has to be increased, and the contact area between the second titanium layer 48 and the gate insulating film 64 has to be reduced. For this purpose, the misregistration of the pattern of the molybdenum-niobium layer 49 with respect to the pattern of the second titanium layer 48 has to be made small. Accordingly, the photomask used for forming the resist pattern 61a which is to be the mask for etching the lower layer wiring 41 is used to form the resist pattern 61b which is to be the mask for etching the upper layer wiring 42. If the photomask used at the time of forming the pattern of the lower layer wiring 41 is used at the time of forming the pattern of the upper layer wiring 42, the misregistration between the patterns caused at the time of fabrication of the photomasks and a shift due to variance in the line widths do not have to be taken into account. Accordingly, the shift of the upper layer wiring 42 with respect to the pattern of the lower layer wiring 41 depends only on alignment accuracy at the time of alignment of the upper layer wiring 42. Therefore, the pattern of the molybdenum-niobium layer 49 can be positioned with respect to the pattern of the second titanium layer 48 with a smallest shift, and the adhesion between the first wiring 40 and the gate insulating film 64 is improved. Moreover, because the number of photomasks to be fabricated is reduced, the manufacturing cost of the liquid crystal display device 1 can be reduced.

Each of the effects is described with respect to the first wiring 40, but the same effects as in the case of the first wiring 40 can be obtained also in the case of the second wiring 50 having the same structure as the first wiring 40.

2. Second Embodiment

The configuration of a liquid crystal display device according to a second embodiment of the present invention, and the arrangement of wirings formed in the liquid crystal display device are the same as the configuration of the liquid crystal display device 1 shown in FIG. 4, and the arrangement of wirings shown in FIG. 5, respectively. Accordingly, in the present embodiment, a block diagram showing the configuration of the liquid crystal display device, a plan view showing the arrangement of wirings, and description thereof will be omitted.

Figure 12:
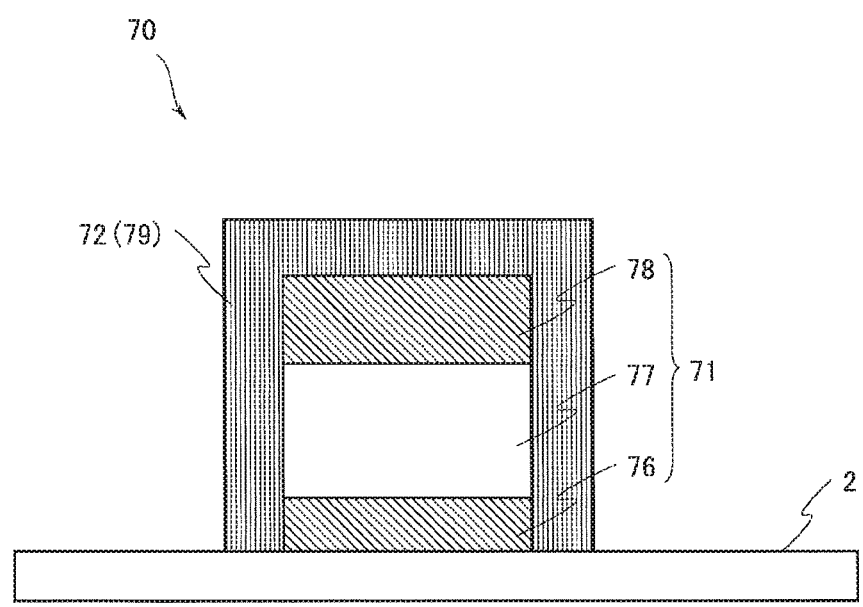
FIG. 12 is a cross-sectional diagram showing a cross-section of a first wiring that is formed in a liquid crystal display device according to a second embodiment.

A wiring structure of a first wiring 70 that is formed in the liquid crystal display device according to the present embodiment will be described in comparison to the wiring structure of the first wiring 40 of the liquid crystal display device 1 according to the first embodiment. FIG. 12 is a cross-sectional diagram showing a cross-section of the first wiring 70 according to the present embodiment. As shown in FIG. 12, the first wiring 70 includes a lower layer wiring 71 having a laminated structure in which a first titanium layer 76, an aluminum layer 77, and a second titanium layer 78 are stacked in this order from an insulating substrate side, and an upper layer wiring 72 which is formed to cover the surface of the lower layer wiring 71, and the upper layer wiring 72 is formed of a molybdenum-niobium layer 79. However, unlike in the case of the first embodiment, the lower layer wiring 71 and the upper layer wiring 72 of the first wiring 70 of the present embodiment are not tapered on both sides, and the side surfaces are approximately perpendicular to the array substrate 2.

According to the present embodiment, as in the case of the first embodiment, adhesion between a gate insulating film (not shown) and the upper layer wiring 72 formed of the molybdenum-niobium layer 79 is improved. Accordingly, as in the case of the first embodiment, the gate insulating film protecting the periphery of a connection terminal having the same structure as the first wiring 70 is not easily peeled off even if a force is applied to the connection terminal in order to peel off a semiconductor chip serving as the scanning signal line drive circuit 5 or as the data signal line drive circuit 6 from the connection terminal, or to remove the ACF remaining on the connection terminal after the semiconductor chip is peeled off, for example. Accordingly, the reliability of the connection terminal can be maintained at a high level. Moreover, the molybdenum-niobium layer 79 has good adhesion to the second titanium layer 78, and the upper layer wiring 72 formed of the molybdenum-niobium layer 79 is not easily peeled off from the lower layer wiring 71.

Furthermore, the number of particles that are attached at the time of formation of the second titanium layer 78 and the molybdenum-niobium layer 79 can be greatly reduced. Thus, parts which are nearly disconnected or parts which are disconnected due to reduced line width caused by the particles can be reduced. Moreover, the probability that the parts where the width of the wiring is reduced or the disconnected parts overlap with one another is extremely low. Accordingly, even if one of the lower layer wiring 71 and the upper layer wiring 72 is disconnected, the conductivity of the first wiring 70 is maintained through the other wiring, and the reliability of the first wiring 70 is greatly increased.

3. Third Embodiment

The configuration of a liquid crystal display device according to a third embodiment of the present invention, and the arrangement of wirings formed in the liquid crystal display device are the same as the configuration of the liquid crystal display device 1 shown in FIG. 4, and the arrangement of wirings shown in FIG. 5, respectively. Accordingly, a block diagram showing the configuration of the liquid crystal display device according to the present embodiment, a plan view showing the arrangement of wirings, and description thereof will be omitted.

Figure 13:
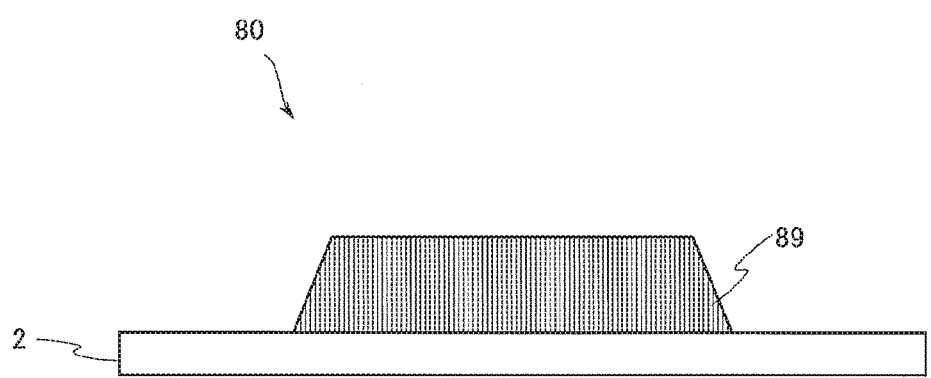
FIG. 13 is a cross-sectional diagram showing a cross-section of a first wiring that is formed in a liquid crystal display device according to a modification of a third embodiment.

A wiring structure of a first wiring 80 that is formed in the liquid crystal display device according to the present embodiment will be described. FIG. 13 is a cross-sectional diagram showing a cross-section of the first wiring 80 according to the present embodiment. As shown in FIG. 13, the first wiring 80 does not include a wiring corresponding to a lower layer wiring, and has a single-layer structure formed of only a molybdenum-niobium layer 89 corresponding to an upper layer wiring. If a gate insulating film (not shown) is formed on the upper surface of the molybdenum-niobium layer 89, because the atomic ratio of oxygen at the interface of the molybdenum-niobium layer 89 is low being 5% or less, adhesion between the molybdenum-niobium layer 89 and the gate insulating film is improved.

According to the present embodiment, as in the case of the first embodiment, the gate insulating film 64 protecting the periphery of a connection terminal having the same structure as the first wiring 80 is not easily peeled off even if a force is applied to the connection terminal in order to peel off a semiconductor chip serving as the scanning signal line drive circuit 5 or as the data signal line drive circuit 6 from the connection terminal, or to remove the ACF remaining after the semiconductor chip is peeled off, for example. Accordingly, the reliability of the wiring including the connection terminal can be maintained at a high level. Because the first wiring is a wiring having a single-layer structure, the manufacturing cost of the liquid crystal display device can be reduced.

4. Others

In each of the embodiment described above, the first wiring is described as a wiring formed of a laminated metal layer where an aluminum layer is sandwiched between titanium layers on both sides, and the second wiring is described as a wiring including a single-layer metal layer formed of a molybdenum-niobium layer. However, the lower layer wiring and the upper layer wiring may be wirings formed of structures and metal layers as described below.

The lower layer wiring may be any one of a single-layer metal layer, a laminated metal layer having two layers, and a laminated metal layer having three layers. As the single-layer metal layer, any one of a titanium layer, a copper (Cu) layer, an aluminum layer, an aluminum alloy layer, a tungsten (W) layer, a chromium (Cr) layer, a tantalum (Ta) layer, and an aluminum-silicon (Al—Si) layer may be used, for example. As the laminated metal layer having two layers, a laminated metal layer formed of any one of combinations: a titanium layer and an aluminum layer; a titanium layer and a copper layer; a titanium layer and an aluminum alloy layer; a titanium layer and a tungsten layer; a titanium layer and a chromium layer; a titanium layer and a tantalum layer; a copper layer and a tungsten layer; a copper layer and a chromium layer; and a copper layer and a tantalum layer may be used, where one of the combination is provided as a lower layer and the other is provided as an upper layer, for example. As the laminated metal layer having three layers, a laminated metal layer having any one of a copper layer, an aluminum alloy layer, a tungsten layer, a chromium layer, a tantalum layer, and an aluminum-silicon layer sandwiched between titanium layers on both sides can be used, for example. Note that, an aluminum alloy layer as described above includes an aluminum-nickel (Ni) based alloy layer such as aluminum-nickel-copper-lanthanum (La).

Furthermore, with respect to each of the lower layer wirings, the upper layer wiring may be a single-layer metal layer made of molybdenum (Mo) instead of the molybdenum-niobium layer. Accordingly, in the present specification, a material containing molybdenum-niobium or molybdenum will be referred to as a molybdenum-based material.

Note that, each of the lower layer wirings is a wiring made of a material having good adhesion to the molybdenum-niobium layer, and has good adhesion to an upper layer wiring made of the molybdenum-based material, and the lower layer wiring is tightly adhered to the upper layer wiring. Also, if the lower layer wiring is formed of a single-layer metal layer, a wiring having a laminated structure which is not easily disconnected can be realized by a simple structure. Moreover, with such a structure, the manufacturing process of a wiring can be reduced, and the material cost can be suppressed, and thus, the manufacturing cost of a wiring can be reduced.

Also, if the lower layer wiring is formed of a laminated metal film having three layers, because titanium films to which only a small number of particles are attached at the time of deposition are used, the probability that a fault pattern is formed at the time of patterning of the lower layer wiring due to a particle is further reduced. The reliability of the wiring can thereby be increased. Moreover, because the metal layer of the lower layer wiring is sandwiched between the titanium layers, which are not easily etched at the time of etching of the upper layer wiring, the lower layer wiring is not easily corroded at the time of etching of the upper layer wiring. Accordingly, the reliability of the wiring can be further increased.

In each of the embodiments described above, the wiring structure of a liquid crystal display device has been described, but the wiring structure of the present invention can also be applied to wirings of a display device such as an organic electro-luminescence (EL) display device.

INDUSTRIAL APPLICABILITY

The present invention is applied to a display device such as a liquid crystal display device.

DESCRIPTION OF REFERENCE CHARACTERS

1: LIQUID CRYSTAL DISPLAY DEVICE
2: ARRAY SUBSTRATE
4: DISPLAY UNIT
5: SCANNING SIGNAL LINE DRIVE CIRCUIT
6: DATA SIGNAL LINE DRIVE CIRCUIT
7: DISPLAY CONTROL CIRCUIT
21: GATE LEAD LINE
22: SOURCE LEAD LINE

23: POWER LINE
40, 70, 80: FIRST WIRING
41, 71, 81: LOWER LAYER WIRING
42, 72, 82: UPPER LAYER WIRING
46, 76, 86: FIRST TITANIUM LAYER
47, 77, 87: ALUMINUM LAYER
48, 78, 88: SECOND TITANIUM LAYER
49, 79, 89: MOLYBDENUM-NIOBIUM LAYER
100: METAL FILM
101: RESIST PATTERN
102: PARTICLE
103: OPENING
104: WIRING
105: FAULT PORTION

The invention claimed is:

1. A method for manufacturing a display device, in which at least a plurality of scanning signal lines, a plurality of data signal lines, or a plurality of types of wirings are wirings having a laminated structure including a lower layer wiring and an upper layer wiring, the method comprising:
    a first photolithography step of forming a first resist pattern for patterning the lower layer wiring;
    a first etching step for forming the lower layer wiring with the first resist pattern as a mask;
    a second photolithography step of forming a second resist pattern for patterning the upper layer wiring; and
    a second etching step for forming the upper layer wiring with the second resist pattern as a mask, wherein
    in the second photolithography step, a same photomask as a photomask that is used in the first photolithography step is used, and an amount of exposure is reduced,
    a wiring layer of a molybdenum-based material is formed on surfaces of at least the plurality of scanning signal lines, the plurality of data signal lines, or the plurality of types of wirings.

2. The method according to claim 1, wherein at least the plurality of scanning signal lines, the plurality of data signal lines, or the plurality of types of wirings are wirings having a laminated structure including a lower layer wiring and an upper layer wiring, and the upper layer wiring is made of the molybdenum-based material and is formed to cover the lower layer wiring.

3. The method according to claim 2, wherein the lower layer wiring is a single-layer wiring defined of any one of a titanium layer, a copper layer, an aluminum layer, an aluminum alloy layer, a tungsten layer, a chromium layer, and an aluminum-silicon layer.

4. The method according to claim 2, wherein the lower layer wiring is a laminated wiring defined of any one of combinations: a titanium layer and an aluminum layer; a titanium layer and a copper layer; a titanium layer and an aluminum alloy layer; a titanium layer and a tungsten layer; a titanium layer and a chromium layer; a titanium layer and a tantalum layer; a copper layer and a tungsten layer; a copper layer and a chromium layer; and a copper layer and a tantalum layer, where one of the combination is provided as a lower layer and the other is provided as an upper layer.

5. The method according to claim 2, wherein the lower layer wiring is a laminated wiring in which any one of an aluminum layer, a copper layer, an aluminum alloy layer, a tungsten layer, a chromium layer, a tantalum layer, and an aluminum-silicon layer is sandwiched between titanium layers on both sides.

6. The method according to claim 1, wherein the plurality of types of wirings include a gate lead line connected to a respective one of the plurality of scanning signal lines, a source lead line connected to a respective one of the plurality of data signal lines, and a power line connected to the scanning signal line drive circuit, the plurality of types of wirings being defined in a same manufacturing step as the plurality of scanning signal lines.

7. The method according to claim 1, wherein
    the plurality of types of wirings include a gate lead line connected to a respective one of the plurality of scanning signal lines, a source lead line connected to a respective one of the plurality of data signal lines, and a power line connected to the scanning signal line drive circuit, and
    at least one of the scanning signal line drive circuit and the data signal line drive circuit is made up of a semiconductor chip or a semiconductor device, and is pressure-bonded, using an anisotropic conductive film, to a connection terminal that is provided at an end portion of the gate lead line, the source lead line, or the power line, and that is defined in a same manufacturing step as the plurality of scanning signal lines.

8. The method according to claim 1, wherein the molybdenum-based material contains molybdenum-niobium or molybdenum.

9. The method according to claim 1, wherein a film thickness of the wiring layer made of the molybdenum-niobium material is 30 nm to 200 nm.

* * * * *